United States Patent [19]
Cho et al.

[11] Patent Number: 5,214,600
[45] Date of Patent: May 25, 1993

[54] SEMICONDUCTOR MEMORY ARRAY HAVING INTERDIGITATED BIT-LINE STRUCTURE

[75] Inventors: Soo-In Cho; Dong-Il Shu, both of Seoul; Hong-Sun Hwang, Taegu, all of Rep. of Korea

[73] Assignee: SamSung Electronics Co., Ltd., Suwon, Rep. of Korea

[21] Appl. No.: 836,159

[22] Filed: Feb. 24, 1992

Related U.S. Application Data

[63] Continuation of Ser. No. 501,793, Mar. 30, 1990, abandoned.

[30] Foreign Application Priority Data

Dec. 30, 1989 [KR] Rep. of Korea ............... 20604/1989

[51] Int. Cl.[5] .......................... G11C 5/06; G11C 7/00; G11C 11/407
[52] U.S. Cl. ...................................... 365/51; 365/63; 365/207; 365/189.01
[58] Field of Search ................... 365/189.01, 205, 206, 365/207, 208, 63, 51

[56] References Cited

U.S. PATENT DOCUMENTS

| | | | |
|---|---|---|---|
| 4,456,977 | 6/1984 | Hayashi | 365/51 |
| 4,586,171 | 4/1986 | Fujishima | 365/207 X |
| 4,733,374 | 3/1988 | Furuyama | 365/208 X |
| 4,761,571 | 8/1988 | Golke et al. | 365/208 X |
| 4,791,616 | 12/1988 | Taguchi et al. | 365/208 X |
| 4,903,344 | 2/1990 | Inoue | 365/51 |
| 5,014,241 | 5/1991 | Asakura et al. | 365/51 |

*Primary Examiner*—Alyssa H. Bowler
*Attorney, Agent, or Firm*—Robert E. Bushnell

[57] ABSTRACT

Disclosed is a layout method for increasing pitches between bit lines and between sense amplifiers so as to easily accomplish fabrication of a semiconductor memory device and a semiconductor memory array capable of reducing the number of sense amplifiers. The semiconductor memory array includes a plurality of bit lines, and a plurality of sense amplifiers, each sense amplifier being connected to each pair of the bit lines, wherein the sense amplifiers placed in each column make up each group, with odd pairs of the bit lines being connected to even or odd sense amplifier groups, and even pairs of the bit lines being connected to even or odd sense amplifier groups.

13 Claims, 3 Drawing Sheets

SEMICONDUCTOR MEMORY ARRAY HAVING INTERDIGITATED BIT-LINE STRUCTURE

This is a continuation of Ser. No. 07/501,793, filed Mar. 30, 1990, abandoned.

BACKGROUND OF THE INVENTION

The present invention relates to a semiconductor memory array, and more specifically, to the semiconductor memory array having a bit line structure capable of increasing the pitch between the bit lines.

In general, a semiconductor memory device includes a plurality of bit lines, a plurality of sense amplifiers, a plurality of word lines, and a plurality of memory cells. However, as the semiconductor memory device tends to have higher packing cells, the pitch between the respective lines is decreased.

In other words, when the pitch between the bit lines is decreased, the pitch between the sense amplifiers is also decreased, and then a layout of the sense amplifiers is difficult.

At this time, miniaturization of a semiconductor memory device makes fabrication of the semiconductor memory device complicated and difficult because of the elaborate pattern of the semiconductor memory device.

In FIG. 1, a conventional memory cell array, pairs of bit lines are connected to each sense amplifier. Referring to FIG. 1, as the number of the sense amplifiers is proportional to how large the capacity of the memory is, parasitic capacitance in the connections between the bit lines and lines from the sense amplifiers increases in accordance with an increase of the capacity of the memory. The increase of the parasitic capacitance causes the operational speed of the sense amplifiers to be slower, so that the access time is delayed.

SUMMARY OF THE INVENTION

Accordingly, it is an object of the present invention to provide a layout method for increasing pitch between bit lines and pitch between sense amplifiers so as to easily accomplish fabrication of a semiconductor memory device.

It is another object of the present invention to provide a semiconductor memory array capable of reducing the number of sense amplifiers.

According to one aspect of the present invention, the semiconductor memory array of the present invention includes a plurality of bit lines, and a plurality of sense amplifiers, each sense amplifier being connected to one pair of each plurality of the bit lines, wherein the sense amplifiers placed in each column make up each group, odd pairs of the bit lines being connected to even or odd sense amplifier groups, even pairs of the bit lines being connected to even or odd sense amplifier groups.

According to another aspect of the present invention, a semiconductor memory array of the present invention includes a plurality of sense amplifiers, and a plurality of bit lines, with bit lines from one amplifier group not being connected to the bit lines from the neighboring sense amplifier groups.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE PREFERRED EMBODIMENT

Figure 1:
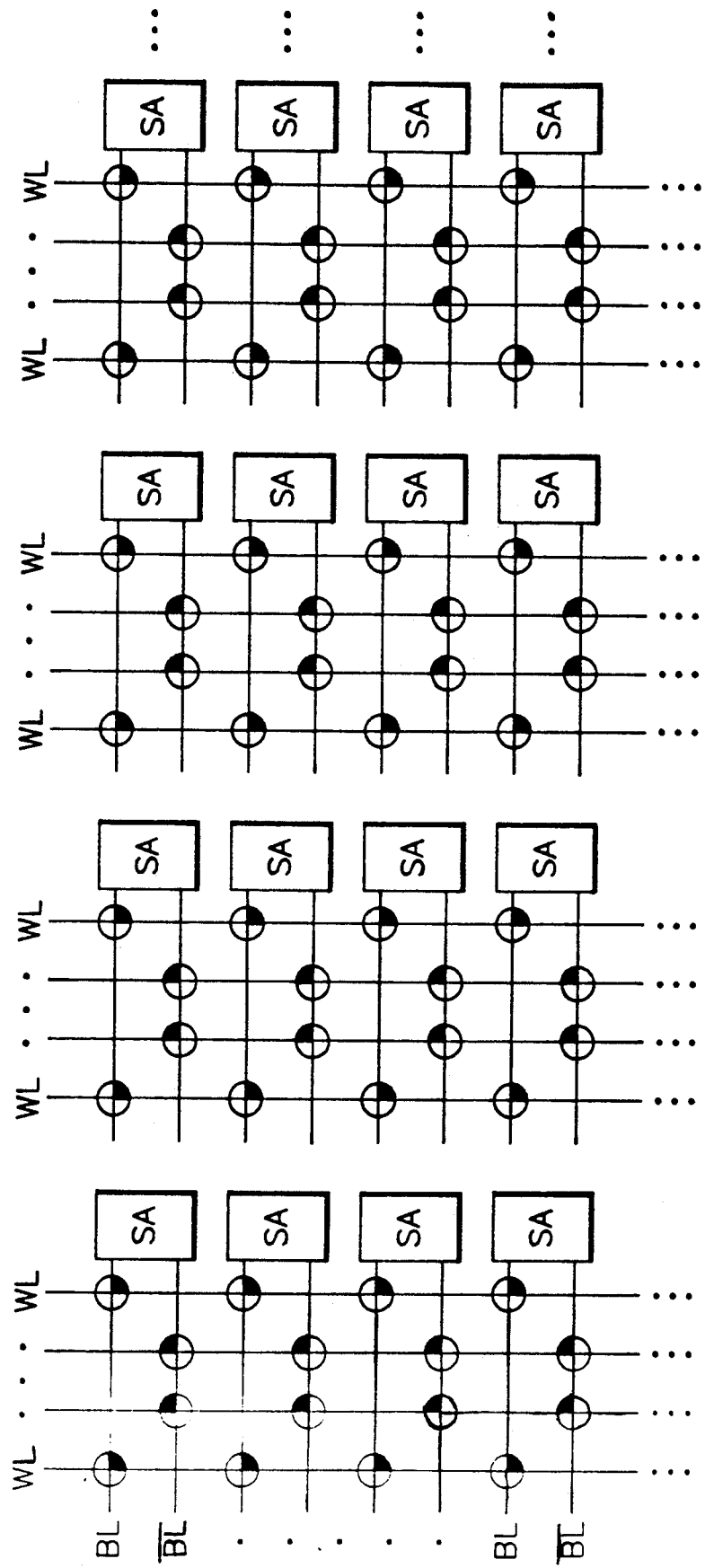
FIG. 1 is a conventional memory array.
Figure 2:
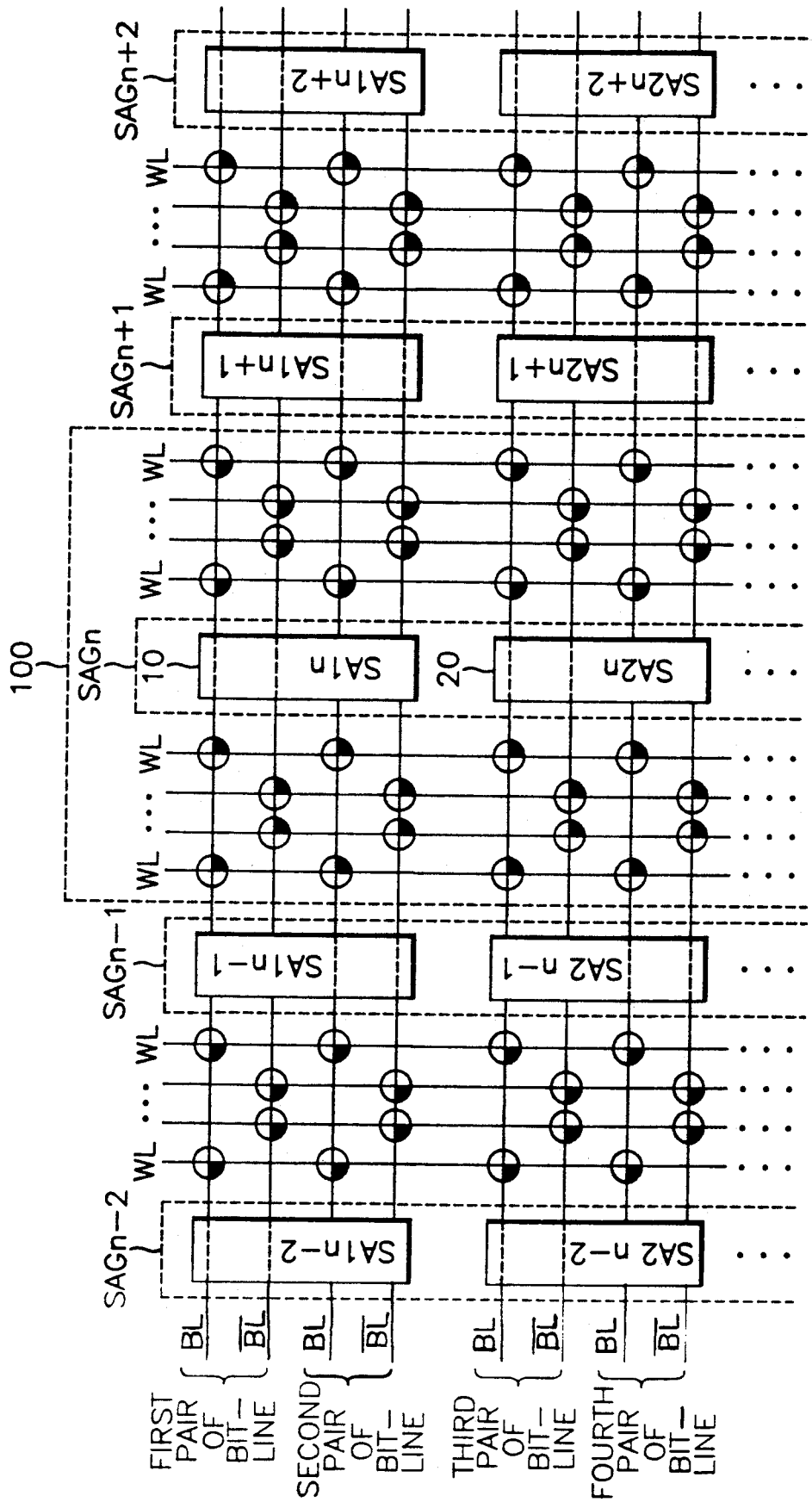
FIG. 2 is a memory array according to the present invention.
Figure 3:
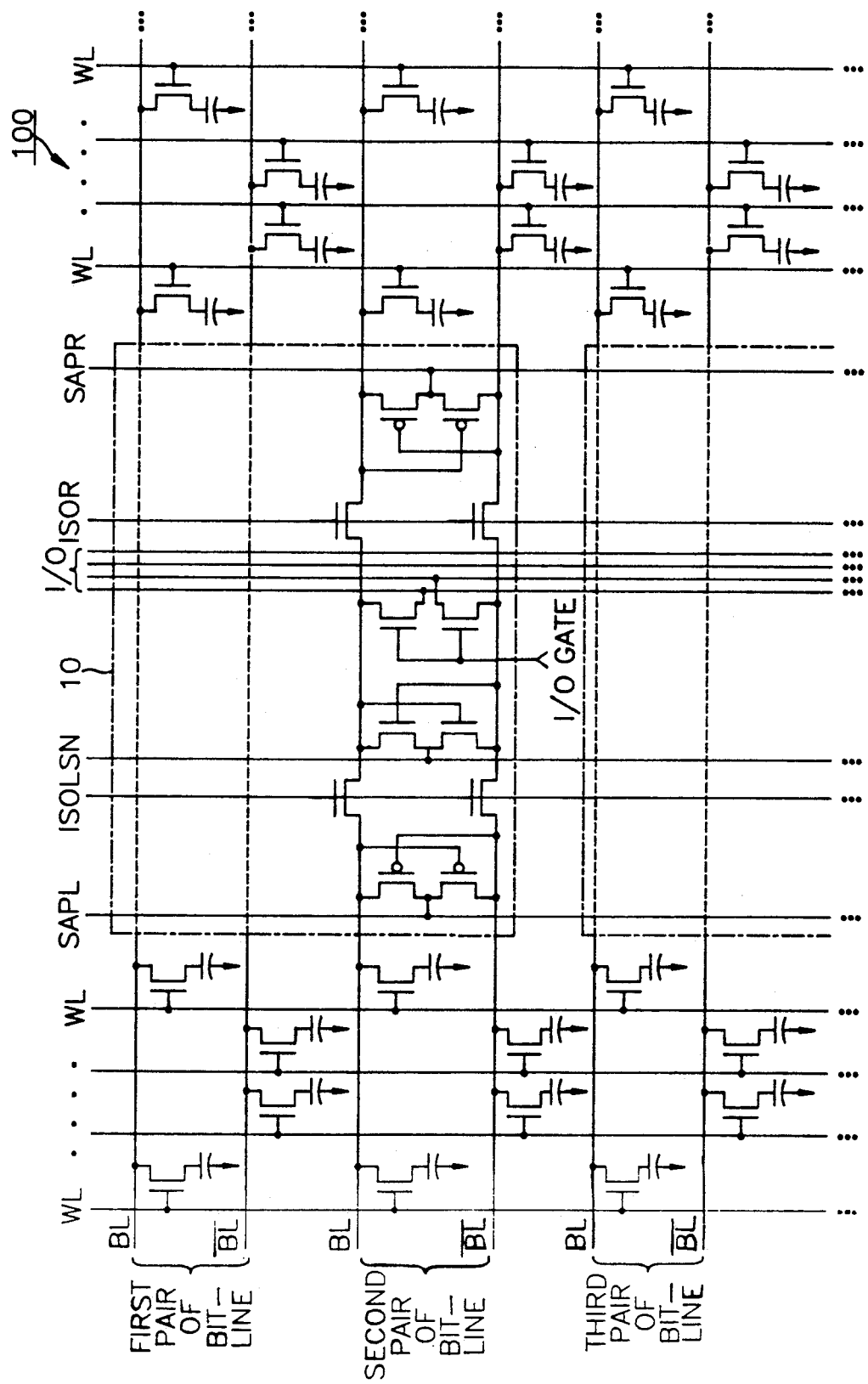
FIG. 3 is a detailed circuit diagram of a portion of FIG. 2.

FIG. 2 illustrates an array of bit lines and sense amplifiers according to the present invention, and FIG. 3 an inner circuit digram of one part 100 of FIG. 2.

Referring to FIG. 2, sense amplifiers make up groups. Each group has the sense amplifiers placed in a column, the pitch between the sense amplifiers is four lines wide. That is, the first pair of the bit lines in a column are connected to the first sense amplifier $SA1_{n-1}$ of the $(n-1)^{th}$ sense amplifier group $SAG_{n-1}$ and to the first sense amplifier $SA1_{n+1}$ of the $(n+1)^{th}$ sense amplifier group $SAG_{n+1}$. The second pair of bit lines are connected to the first sense amplifier $SA1_{n-2}$ of the $(n-2)^{th}$ group $SAG_{n-2}$ and to the first sense amplifier $SA1_n$ of the nth sense amplifier group $SAG_n$ and to the first sense amplifier $SA1_{n+2}$ of the $(n+2)^{th}$ sense amplifier group $SAG_{n+2}$. The third pairs of bit lines are connected to the second sense amplifier $SA2_{n-1}$ of the $(n-1)^{th}$ sense amplifier group $SAG_{n-1}$ and to the second sense amplifier $SA2_{n+1}$ of the $(n+1)^{th}$ sense amplifier group $SAG_{n+1}$. The fourth pair of bit lines are connected to the second amplifier $SA2_{n-2}$ of the $(n-2)^{th}$ sense amplifier group $SAG_{n-2}$ and to the second sense amplifier $SA2_n$ of the nth sense amplifier group $SAG_n$ and to the second sense amplifier $SA2_{n+2}$ of the $(n+2)^{th}$ sense amplifier group $SAG_{n+2}$. The dashed lines in FIG. 2 (and FIG. 3) indicate where the bit lines pass under a sense amplifier, i.e. the dashed lines do not indicate a connection between elements.

Accordingly, it is rightly understood that the $2k^{th}$ (k: positive integer) pairs of bit lines are connected to the $k^{th}$ sense amplifiers $SAk_{n-2}$ of the $(n-2)^{th}$ sense amplifier group $SAG_{n-2}$ and to the $k^{th}$ sense amplifiers $SAk_n$ of the $n^{th}$ sense amplifier group $SAG_n$ and to the $k^{th}$ sense amplifiers $SAk_{n+2}$ of the $(n+2)^{th}$ sense amplifier group $SAK_{n+2}$, and that the $(2k+1)^{th}$ pairs of bit lines are connected to the $k^{th}$ sense amplifiers $SAK_{n-1}$ of the $(n-1)^{th}$ sense amplifier group $SAG_{n-1}$ and to the $k^{th}$ sense amplifier $SAK_{n+1}$ of the $(n+1)^{th}$ sense amplifier group $SAG_{n+1}$ respectively.

On the other hand, another method to interconnect the bit lines with the sense amplifiers can be proposed. That is, the $2k^{th}$ pairs of bit lines are connected to the $k^{th}$ sense amplifier $SAK_{n-1}$ of the $(n-1)^{th}$ sense amplifier group $SAG_{n-1}$ and to the $k^{th}$ sense amplifier $SAK$ $n+1$ of the $(n+1)^{th}$ sense amplifier group $SAG_{n+1}$, while the $(2k-1)^{th}$ pairs of bit lines are connected to the $k^{th}$ sense amplifier $SAK_{n-2}$ of the $(n-2)^{th}$ sense amplifier group $SAG_{n-2}$ and to the $k^{th}$ sense amplifier $SAK_n$ of the $n^{th}$ sense amplifier group $SAG_n$ and to the $k^{th}$ sense amplifier $SAK_{n+2}$ of the $(n+2)^{th}$ sense amplifier group $SAG_{n+2}$ respectively.

Since the pitch between the sense amplifiers in accordance with the present invention is two-bit-line wider than the conventional pitch between the sense amplifiers, the pattern of the sense amplifiers becomes relaxed. It is known from the inner circuit diagram of FIG. 3 that since the number of the sense amplifiers which are connected to the common sensing node SN is also decreased by half, the parasitic capacitance in the common sensing node SN is decreased by half. Accordingly, a decrease of the parasitic capacitance in the common sensing node SN accelerates the sensing operation. In FIG. 3, the lines SAPL and SAPR are restore clocks, and ISOL and ISOR are lines for isolating the bit lines from the sense amplifiers.

As illustrated hereinabove, the present invention has an advantage in that the increased pitch between the sense amplifiers enables the layout of the semiconductor memory array of higher packing memory cells to be easily accomplished.

The present invention has another advantage in that since the parasitic capacitance in the common sensing node is decreased, the sensing operation is more quickly achieved.

The foregoing description shows only a preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A semiconductor memory array comprising:
    a plurality of odd row bit line pairs;
    a plurality of even row bit line pairs;
    a plurality of odd columns of sense amplifiers arranged in a plurality of even rows;
    a plurality of even columns of sense amplifiers arranged in a plurality of odd rows;
    each odd row bit line pair being connected to all of said sense amplifiers in a corresponding odd row for each of said even columns of sense amplifiers; and
    each even row bit line pair being connected to all of said sense amplifiers in a corresponding even row for each of said odd columns of sense amplifiers.

2. The semiconductor memory array as claimed in claim 1, further comprising:
    a plurality of word lines arranged between each of said even columns and odd columns.

3. The semiconductor memory array as claimed in claim 2 wherein said plurality of word lines comprises at least four word lines.

4. A semiconductor memory array comprising:
    a plurality of odd bit line pairs arranged in a plurality of odd rows;
    a plurality of even bit line pairs arranged in a plurality of even rows;
    a plurality of odd columns having a plurality of odd column sense amplifiers arranged in said plurality of even rows;
    a plurality of even columns having a plurality of even column sense amplifiers arranged in said plurality of odd rows;
    each odd bit line pair being connected to all of said even column sense amplifiers in a corresponding odd row; and
    each even bit line pair being connected to all of said odd column sense amplifiers in a corresponding even row.

5. The semiconductor memory array as claimed in claim 4, further comprising:
    a predetermined number of word lines arranged between said odd column sense amplifiers in a first odd column and said even column sense amplifiers in a first even column; and
    a predetermined number of word lines arranged between said odd column sense amplifiers in a second odd column and said even column sense amplifiers in said first even column.

6. The semiconductor memory array as claimed in claim 5, further comprising:
    a predetermined number of word lines arranged between said odd column sense amplifiers in said second odd column and said even column sense amplifiers in a second even column; and
    a predetermined number of word lines arranged between said even column sense amplifiers in said second even column and said odd column sense amplifiers in a third odd column.

7. The semiconductor memory array as claimed in claim 6 wherein said predetermined number is at least four.

8. A semiconductor memory array comprising:
    a plurality of groups of sense amplifiers, each group comprising a plurality of sense amplifiers arranged in a column, wherein said plurality of groups are arranged in a plurality of even columns of sense amplifiers and a plurality of odd columns of sense amplifiers;
    a first bit line pair connected to a first one of said sense amplifiers in each of said even columns of sense amplifiers; and
    a second bit line pair connected to a first one of said sense amplifiers in each of said odd columns of sense amplifiers.

9. A semiconductor memory array as claimed in claim 8, wherein each of said even columns of sense amplifiers is separated from a neighboring odd column of sense amplifiers by a number of word lines.

10. A semiconductor memory array comprising:
    a plurality of sense amplifiers arranged in a first column;
    a plurality of sense amplifiers arranged in a second column adjacent to said first column and being separated from said first column by a predetermined number of first word lines;
    a plurality of sense amplifiers arranged in a third column adjacent to said second column and being separated from said second column by a predetermined number of second word lines;
    a first bit line connected to a first sense amplifier in said second column;
    a second bit line connected to said first sense amplifier in said second column;
    a third bit line connected to a first sense amplifier in said first column and a first sense amplifier in said third column; and
    a fourth bit line connected to said first sense amplifier in said first column and said first sense amplifier in said third column.

11. The semiconductor memory array as claimed in claim 10 further comprising:
    a fifth bit line connected to a second sense amplifier in said second column;
    a sixth bit line connected to said second sense amplifier in said second column;
    a seventh bit line connected to a second sense amplifier in said first column and a second sense amplifier in said third column; and
    an eighth bit line connected to said second sense amplifier in said first column and said second sense amplifier in said third column.

12. The semiconductor memory array as claimed in claim 11, wherein:

said first and second bit lines comprise a first bit line pair;

said third and fourth bit lines comprise a second bit line pair;

said fifth and sixth bit lines comprise a third bit line pair; and said seventh and eighth bit lines comprise a fourth bit line pair.

13. The semiconductor memory array as claimed in claim 12, further comprising:

a plurality of sense amplifiers arranged in a fourth column adjacent to said third column and being separated from said third column by a predetermined number of third word lines;

a plurality of sense amplifiers arranged in a fifth column adjacent to said fourth column and being separated from said fourth column by a predetermined number of fourth word lines;

said first bit line pair being connected to a first sense amplifier in said fourth column;

said second bit line pair being connected to a first sense amplifier in said fifth column;

said third bit line pair being connected to a second sense amplifier in said fourth column; and said fourth bit line pair being connected to a second sense amplifier in said fifth column.

* * * * *

UNITED STATES PATENT AND TRADEMARK OFFICE
CERTIFICATE OF CORRECTION

PATENT NO. : 5,214,600
DATED : 25 May 1993
INVENTOR(S) : Soo-In Cho, et al.

It is certified that error appears in the above-identified patent and that said Letters Patent is hereby corrected as shown below:

Column 2,

Line 23,     change "pairs" to --pair--;

Line 45,     change "amplifier" (first occurrence) to --amplifiers--;

Line 51,     change "SAK": to -- $SAK_{n+1}$ --;

Line 52,     delete "n + 1" (first occurrence);

Signed and Sealed this

Sixteenth Day of August, 1994

Attest:

BRUCE LEHMAN

*Attesting Officer*      *Commissioner of Patents and Trademarks*